United States Patent [19]

Murphy et al.

[11] Patent Number: 4,559,613

[45] Date of Patent: Dec. 17, 1985

[54] DIGITAL FREQUENCY SYNTHESIZER CIRCUIT

[75] Inventors: John W. Murphy, Cedar Rapids, Iowa; David K. Vail, Palm Bay, Fla.

[73] Assignee: The United States of America as represented by the Secretary of the Air Force, Washington, D.C.

[21] Appl. No.: 393,236

[22] Filed: Jun. 29, 1982

[51] Int. Cl.[4] .............................................. H03L 7/18
[52] U.S. Cl. ....................................... 364/703; 377/48
[58] Field of Search .................... 364/703; 377/48, 52; 328/14

[56] References Cited

U.S. PATENT DOCUMENTS 4,053,739 10/1977 Miller et al. ......................... 364/703
4,349,887  9/1982 Crowley ............................... 364/703
4,423,381 12/1983 Stepp et al. ............................ 328/14

Primary Examiner—David H. Malzahn
Attorney, Agent, or Firm—Donald J. Singer; Jacob N. Erlich

[57] ABSTRACT

A high-resolution digital pulse to digital pulse divider circuit directly synthesizes precise frequencies having low phase noise content and phase continuity when frequency changes occur.

3 Claims, 5 Drawing Figures

DIGITAL FREQUENCY SYNTHESIZER CIRCUIT

The present invention was made under a United States Government contract and may be made or used by or on behalf of the Government without the payment of any royalties.

BACKGROUND OF THE INVENTION

The invention relates to digital frequency synthesis, and more particularly, to a high-resolution, programmable digital frequency divider.

In electronic position-fixing systems such as those having transmitters carried in earth-orbitting satellites, it is necessary for a receiver to determine the magnitude of the Doppler shift component of the signal received from the satellite, including contribution to the Doppler shift from the user's motion. In one such position-fixing system, the carrier signals are modulated with pseudo-random noise codes. The codes facilitate satellite identification (each satellite having a unique code), and measurement of the signal propagation time from satellite to user. The receiver synchronizes with the code of a particular satellite by generating within the receiver the code for the satellite, and then correlating the locally generated code with the received signal. After synchronization, both the phase of the carrier signal and the code sequence timing are continuously tracked. One such pseudo-random noise code utilized in the Navstar-Global Positioning System (GPS) is termed a P (Precision) code. The P code operates at 10.23 megabits per second and has a complete cycle of 267 days, each satellite generating an exclusive 7-day long segment of the code. Accordingly, the code generator in the receiver must be capable of extremely fine resolution in order to maintain track and synchronization of the code sequence timing in an environment where the Doppler shift of a 10.23 Mhz signal due to the user's vehicle motion may range from only a few Hertz to several hundred Hertz.

In accordance with the present invention, a first adder/accumulator circuit operating at the code clock frequency controls a dual modulus divider circuit to divide an input digital pulse signal by a fractional quantity to generate a nominal 10.23 MHz code clock. A binary signal representative of the desired Doppler shift is iteratively added it itself in a binary adder/accumulator circuit until a positive or negative overflow signal is generated. The overflow signal, coupled to the first adder/accumulator circuit, controls that circuit to alter the division ratio of the dual modulus divider circuit, thereby altering the code clock frequency by the desired amount.

BRIEF DESCRIPTION OF THE DRAWING

The invention is pointed out with particularity in the appended claims; however, other objects and features will become more apparent and the invention itself will best be understood by referring to the following descriptions and embodiments taken in conjunction with the accompanying drawing in which:

DESCRIPTION OF THE PREFERRED EMBODIMENT

Figure 1:
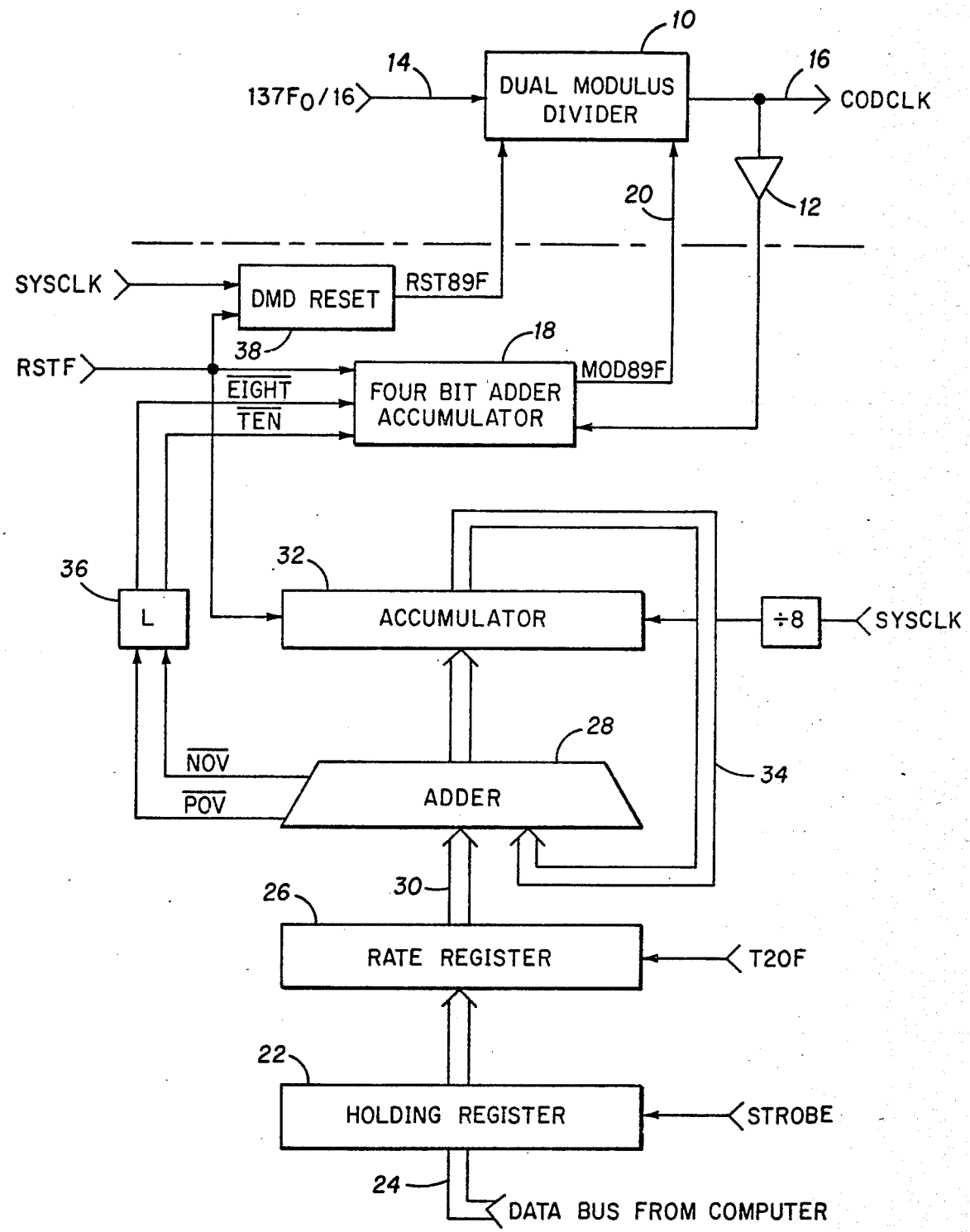
FIG. 1 is a block diagram of a circuit in accordance with the present invention.
Figure 3:
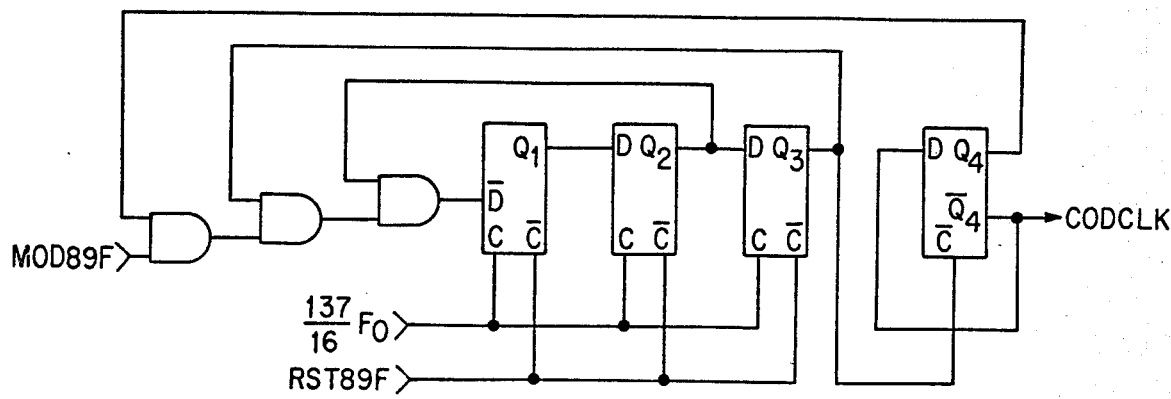
FIG. 3 is a logic diagram of the dual modulus divider of the circuit in accordance with the present invention.

Referring now to the various views of the drawing for a detailed description of the operation, construction, and other features of the invention by characters of reference, FIG. 1 shows a dual modulus divider circuit 10 which in the presently described embodiment of the invention is implemented in emitter-coupled logic (ECL), and an ECL to CMOS level converter circuit 12. The horizontal broken line bifurcating FIG. 1 indicates a division between the kinds of circuit technology utilized in the implementation of the instant embodiment of the invention, the circuits above the broken line being ECL, and circuits below the line being large-scale integration complementary metal-oxide-semiconductor (LSI CMOS). The dual modulus divider circuit 10 receives via a line 14 an input signal having a frequency of (137/16) $F_o$ or 87.59 MHz from a pulse-digital external signal source (not shown), $F_o$ being 10.23 MHz. The dual modulus divider circuit 10 generates on a line 16 an output signal CODCLK having a nominal frequency of 10.23 MHz, the frequency of the CODCLK signal being a fractional submultiple by 16/137 of the input signal frequency. The dual modulus divider circuit 10 is implemented as a counter with D-bistables as shown in FIG. 3 to count 8 or 9 cycles of the input signal (137/16) $F_o$ in accordance with the count sequence shown in Table 1. A commercially available integrated circuit may be utilized for the dual modulus divider circuit 10; for example, the circuit 10 of the presently described embodiment is an SP8691A integrated circuit manufactured by Plessey Semiconductors. An extra logic state of the dual modulus divider circuit 10, indicated by an asterisk in Table 1, occurs when a control signal MOD89F, generated by a four-bit adder/accumulator circuit 18 (FIG. 1) and coupled to the dual modulus divider circuit 10 via a line 20 is enabled. The MOD89F signal thus controls the division ratio of the dual modulus divider circuit 10 in accordance with Table 2.

TABLE 1

| Q1 | Q2 | Q3 | Q4 |
|---|---|---|---|
| 1 | 0 | 0 | 1 |
| 1 | 1 | 0 | 1 |
| 0 | 1 | 1 | 1 |
| 0 | 0 | 1 | 1 |
| 1 | 0 | 0 | 0 |
| 1 | 1 | 0 | 0 |
| 0 | 1 | 1 | 0 |
| 0 | 0 | 1 | 0 |
| *0 | 0 | 0 | 1 |

TABLE 2

| Control Signal | Division Ratio |
|---|---|
| $\overline{\text{MOD89F}}$ | 8 |
| MOD89F | 9 |

Figure 2:
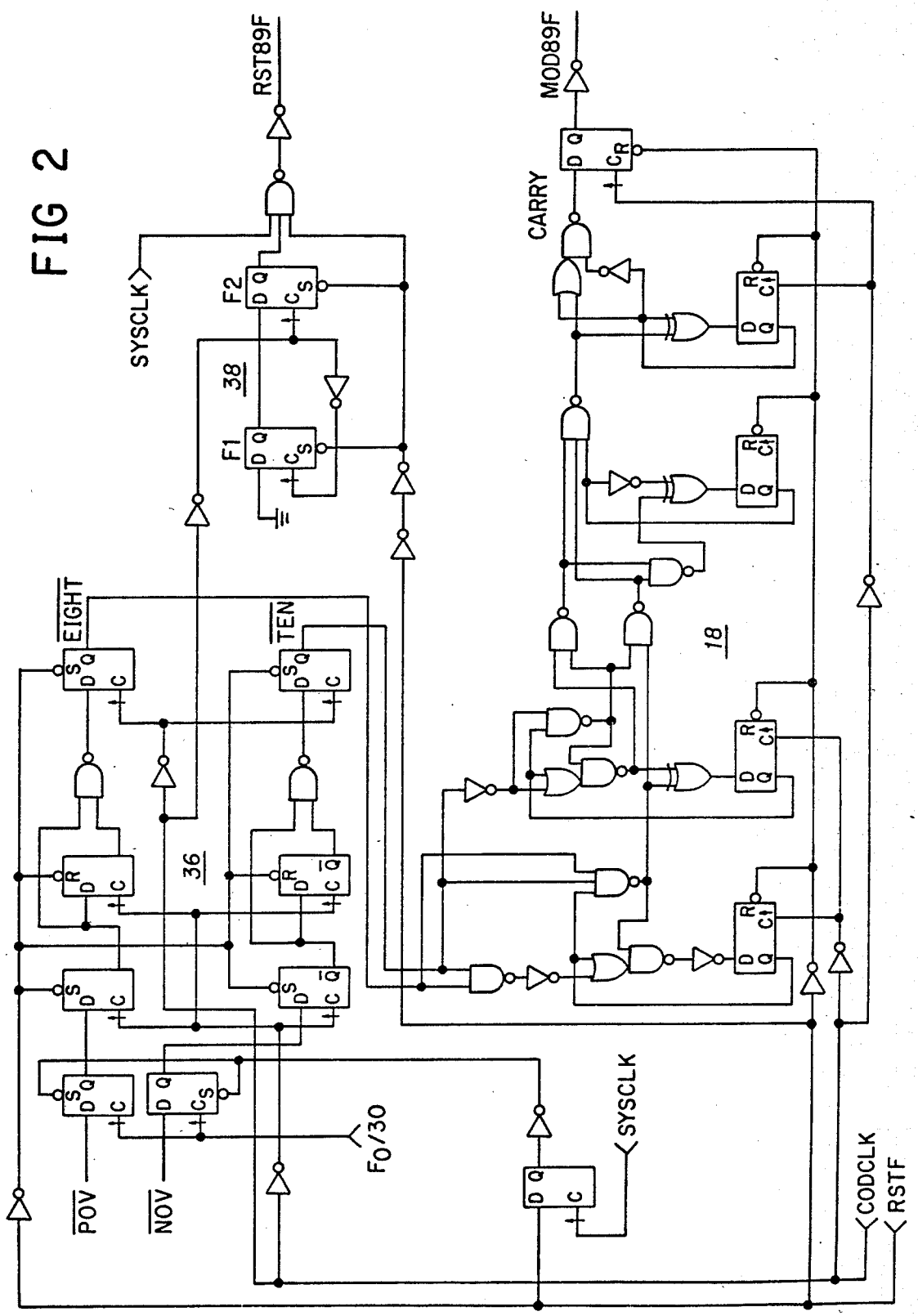
FIG. 2 is a detailed logic diagram showing the accumulator and associated circuitry of the present invention.
Figure 4:
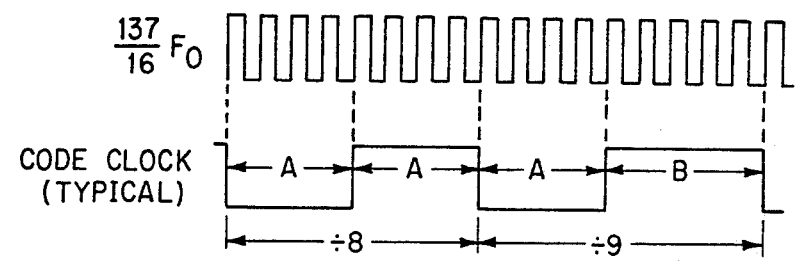
FIGS. 4 and 5 are timing diagrams useful in explaining the operation of the invention.

FIG. 4 shows the code clock signal output of the dual modulus divider circuit 10 with respect to the (137/16) $F_o$ input signal, the latter having a pulse period of 11.416 nanoseconds. The periods of the code clock signal shown in FIG. 4 corresponding with the ÷8 and ÷9 cycles and designated A and B in FIG. 4 have periods, respectively, of 45.665 and 57.081 nanoseconds. The code clock signal output thus is comprised of 4/8 duty cycle balanced square waves having a period of 91.33 nanoseconds, and 5/9 duty cycle unbalanced square waves with a period of 102.746 nanoseconds. The four-bit adder/accumulator circuit 18 is implemented as shown in FIG. 2 to add $9_{10}$ to itself each clock period, when two input signals thereto designated EIGHT and TEN are both enabled. When a nominal 10.23 MHz signal is being generated by the dual modulus divider 10, the four-bit adder/accumulator circuit 18 has a fixed addend of $9_{10}$ and counts as shown in Table 3, generating carries as the MOD89F control signal. During a period of 16 nominal cycles of the CODCLK signal, the 4-bit adder/accumulator circuit 18 generates nine MOD89F signals, resulting in nine ÷9 cycles and seven ÷8 cycles of the dual modulus divider circuit 10 yielding a fractional divisor of 137/16 and a nominal code CODCLK signal having a frequency $F_o$ or 10.23 MHz.

TABLE 3

| Clock Cycles | | | | | MOD89F |
|---|---|---|---|---|---|
| 1 | 0 | 0 | 0 | 0 | 1 |
| 2 | 1 | 0 | 0 | 1 | 0 |
| 3 | 0 | 1 | 0 | 0 | 1 |
| 4 | 1 | 1 | 0 | 0 | 0 |
| 5 | 0 | 0 | 1 | 0 | 1 |
| 6 | 1 | 0 | 1 | 1 | 0 |
| 7 | 0 | 1 | 1 | 0 | 1 |
| 8 | 1 | 1 | 1 | 1 | 0 |
| 9 | 0 | 0 | 0 | 1 | 1 |
| 10 | 1 | 0 | 0 | 0 | 1 |
| 11 | 0 | 1 | 0 | 1 | 0 |
| 12 | 1 | 1 | 0 | 0 | 1 |
| 13 | 0 | 0 | 1 | 1 | 0 |
| 14 | 1 | 0 | 1 | 0 | 1 |
| 15 | 0 | 1 | 1 | 1 | 0 |
| 16 | 1 | 1 | 1 | 0 | 1 |

With respect to the dual modulus divider circuit 10, the bit values of the four-bit adder/accumulator are fractional, the most-significant bit having a value of $2^{-1}$; the least-significant bit, $2^{-4}$. The four-bit adder/accumulator circuit 18 thus generates fractional partial divisors 9/16 and 8/16 of the (137/16) $F_o$ input signal over a period of 16 cycles of the code clock, when the MOD89F signal is, respectively, enabled and disabled. A carry signal, i.e., the MOD89F signal, is thus generated at a rate which results in a nominal code clock signal of exactly 10.23 MHz with minimal phase noise.

A data item comprising a 16-bit fractional binary number representative of a desired Doppler shift to be imparted to the CODCLK signal generated by the dual modulus divider circuit 10 is strobed into a 16-bit holding register 22 via a data bus 24 coupled thereto from a computer (not shown) associated with the equipment utilizing the instant invention which may be, for example, a GPS receiver. The 16-bit binary number is loaded periodically in parallel into a 16-bit rate register 26 by a control signal T20F which in the presently described embodiment of the invention occurs every 20 milliseconds. A 16-bit binary adder 28 receives as one input thereto the output signals of the 16-bit rate register via a bus 30. The output signals of the adder 28 are clocked into a 16-bit accumulator 32 by a clock signal having a frequency of $F_o/30$, which signal is derived from a (4/15) $F_o$ signal SYSCLK divided by eight, the $F_o/30$ clock signal having a rate of 2.933 MHz. Output signals of the 16-bit accumulator 32 are coupled in parallel via a bus 34 to the 16-bit adder 28 as second inputs thereto. The data item strobed into the holding register 22 is in two's complement form. The 16-bit binary number in the rate register 26 is thus added to itself each 2.933 microseconds. A positive or a negative overflow of the 16-bit adder 28 results in the generation, respectively, of $\overline{POV}$ or $\overline{NOV}$ signals which are coupled to a latch circuit 36. The latch circuit 36 which is shown in detail in FIG. 2 regenerates the $\overline{POV}$ and $\overline{NOV}$ signals, respectively, as the $\overline{EIGHT}$ and $\overline{TEN}$ signals input to the four-bit adder/accumulator circuit 18. Upon the occurrence of a positive overflow from the adder 28, the $\overline{EIGHT}$ signal is disabled for one cycle of the CODCLK signal and the addend of the four-bit adder/accumulator circuit 18 is incremented to $8_{10}$ for one cycle; consequently the number of ÷9 cycles of the dual modulus divider circuit 10 is reduced with respect to the number of ÷8 cycles and the frequency of the CODCLK signal increases. Similarly, a negative overflow of the adder 28 disables the $\overline{TEN}$ signal and the addend of the four-bit adder/accumulator circuit 18 is incremented to $10_{10}$ for one cycle of the CODCLK signal resulting in a reduced frequency of the CODCLK signal. A data value of zero in the 16-bit rate register 26 results in the generation of the nominal frequency (10.23 MHz) of the CODCLK signal; positive and negative data values in the rate register 26 result, respectively, in higher and lower frequencies of the CODCLK signal. As frequency shifts occur, the circuit of the instant invention maintains phase continuity of the pulse train at the boundaries of changes in frequency. Long term drift of the code clock signal, a vital consideration in tracking a precision pseudo-random noise code such as the P code utilized in the GPS, is thus eliminated.

The range and resolution of the circuit of the present invention is shown as follows, where:

FiN = Clock to Dual Modulus Divider 10 (137 $F_o$/16)

CODCLK = Code Clock Output; Clock to Four-Bit Adder/Accumulator 18

MOD89F = Carry from Four-bit Adder/Accumulator 18 f16 = Clock to 16 Bit Accumulator 32 ($F_o/30$)

R = Rate Value in 16 Bit Accumulator 32

NU = Upper Divide Modulus of Dual Modulus Divider (9)

NL = Lower Divide Modulus of Dual Modulus Divider (8)

$$CODCLK = \frac{fiN}{NL} + MOD89F\left(1 - \frac{NU}{NL}\right)$$

$$MOD89F = \frac{9}{16} CODCLK - \frac{1}{16} R(f16)$$

$$CODCLK = \left(\frac{137}{16} F_o/8\right) +$$

$$\left(1 - \frac{9}{8}\right)\left(\frac{9}{16} CODCLK - \frac{R}{16} \frac{F_o}{30}\right)$$

$$CODCLK = \frac{137}{128} F_o - \frac{9}{128} CODCLK + \frac{R}{128} \frac{F_o}{30}$$

-continued $$CODCLK = F_o + \frac{R}{128} \cdot \frac{F_o}{30} \cdot \frac{128}{137} = F_o + F_o \frac{R}{4110}$$

R may vary from $-0.5_{10}$ to $+0.5_{10}$.

Therefore, $CODCLK = F_o \pm (0.5/4110) F_o$, and the range of the circuit $= \pm 1.245$ kHz about the nominal frequency of 10.23 MHz. The least significant bit of the rate register has a weight of $2^{-16}$. Therefore the resolution of the circuit of the presently described embodiment of the invention is 0.03798 Hz.

The circuit of the present invention is characterized by high resolution, low phase noise (in a digital pulse to digital pulse environment) and phase continuity at frequency-shift boundaries; a phase noise analysis follows. It is initially assumed that the $\div 8$ and $\div 9$ cycles are distributed over time so that the phase error of the code clock with respect to an ideal square wave does not exceed $\pm \theta/2$.

$$\text{One CODCLK period of} \div 8 \rightarrow \frac{1}{(137/16)F_o (1/8)} = 91.33 \text{ ns.}$$

$$\text{One CODCLK period of} \div 9 \rightarrow \frac{1}{(137/16)F_o (1/9)} = 102.74 \text{ ns.}$$

$$\text{Peak-to-peak error} \rightarrow \frac{102.74 - 91.33}{97.75} = 0.117 \text{ cycles.}$$

$$\theta = .117 \times 360° = 42°$$

Assume the probability distribution of the phase error is uniform over the interval $-\theta/2 + \theta/2$ $$P(\sigma) = 1/\theta \text{ for } -\theta/2 \leq \sigma \leq +\theta/2$$

$$C(\sigma) = \frac{(360° - |\sigma|)^2}{360°}$$

The average power output is:

$$\int_{-\infty}^{\infty} P(\sigma)C(\sigma)d\sigma \; P_o \longrightarrow \text{ normalized power output}$$

$$P_o = 2 \int_0^{\theta/2} 1/\theta \left( \frac{360 - \sigma}{360} \right)^2 d\sigma$$

$$P_o = 2/\theta \left( \sigma - \frac{\sigma^2}{360} + \frac{\sigma^3}{3 \cdot 360^2} \right) \bigg|_0^{\theta/2}$$

$$P_o = 1 - \frac{\theta}{720} + \frac{\theta^2}{12 \cdot 360°}$$

For $\theta = 42° \longrightarrow P_o = .9428 \longrightarrow -0.26$ dB

Receiver performance penalty is therefore, 0.26 dB (with nominal $CODCLK = F_o$ output).
Each overflow from the 16-bit accumulator represents:

$$\frac{1245 \frac{\text{cycles}}{\text{sec}} \text{ (max Doppler)}}{\left(\frac{1}{2}\right)\left(\frac{1}{30}\right) F_o \frac{\text{overflows}}{\text{sec}}} = 7.3E - 3 \text{ cycles}$$

Peak-to-peak phase error is 7.3E-3 cycles $= 2.6°$ $$P_o = 1 - \frac{2.6}{720} + \frac{(2.6)^2}{12(360)^2} = -0.015 \text{ dB}$$

A performance penalty occurs only when the frequency of overflows is high compared to code-tracking bandwidth. Total performance penalty is 0.275 dB. Peak position error is:

$$\left(\frac{1}{2}\right) (7.3E - 3 \text{ cycles}) \left(30 \frac{m}{\text{cycle}}\right) = 0.11 \text{ meters}$$

This results in a pseudorange error only if the frequency of the overflows is low compared to the bandwidth of the code-tracking loop.

Figure 5:
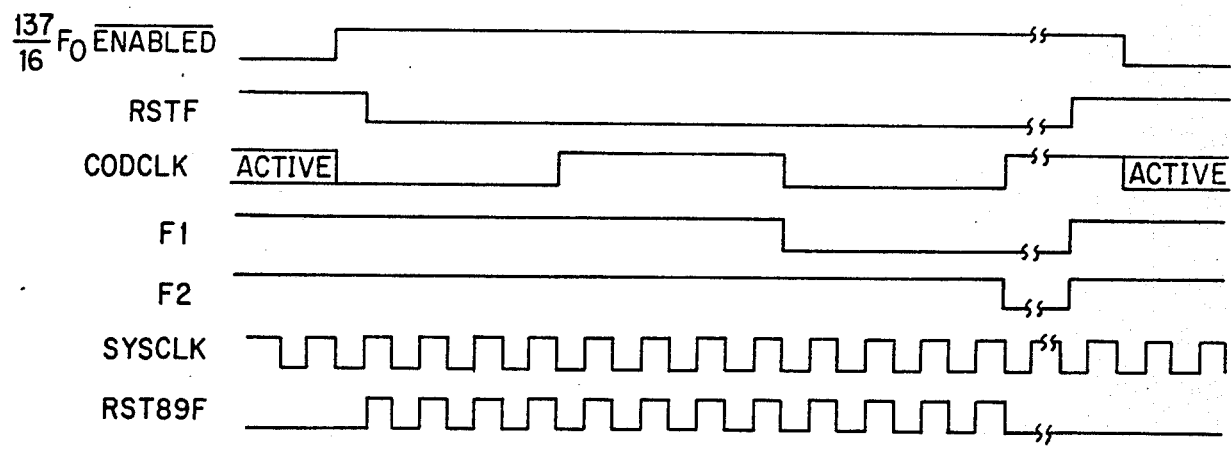

Referring now to FIGS. 1 and 2 in conjunction with FIG. 5, a dual modulus divider reset circuit 38 on the LSI CMOS chip generates a signal RST89F utilized to reset the ECL dual modulus divider circuit 10, the latter not being provided with a reset input. Because the code clock position must be known to within one period of the 137 $F_o/16$ input clock, the reset circuit 38 is utilized to reset the dual modulus divider circuit 10. During a reset operation, the 137 $F_o/16$ clock to the dual modulus divider circuit 10 is disabled and the dual modulus divider is clocked by the RST89F signal until a rising edge of the CODCLK signal resets bistable F2 of the reset circuit 38. The dual modulus divider circuit 10 remains in this state until the 137 $F_o/16$ clock is restarted.

While the principles of the invention have now been made clear in the foregoing illustrative embodiment, there will be immediately obvious to those skilled in the art many modifications of structure, arrangement, proportions, the elements, material and components used in the practice of the invention, and otherwise, which are particularly adapted for specific environments and operating requirements without departing from those principles. The appended claims are, therefore, intended to cover and embrace any such modifications within the limits only of the true spirit and scope of the invention.

What is claimed is:

1. Apparatus for generating an output signal having a predetermined nominal frequency and including means for shifting the frequency of said output signal by a predetermined amount, said apparatus comprising:
    a dual modulus divider circuit having an input connected to receive a pulse signal having a frequency to be divided, and an input connected to receive a first control signal, said divider circuit dividing the pulse signal by an upper divide modulus when the first control signal is enabled and a lower divide modulus when the first control signal is disabled;
    a first binary adder/accumulator circuit generating the first control signal as a carry output thereof, said first binary adder/accumulator circuit controlling the ratio and distribution of upper to lower divide modulus cycles of said dual modulus divider circuit, the frequency of occurrence of said control signal being determined by an addend iteratively added in said first binary adder/accumulator circuit at the rate of said output signal, said first binary adder/accumulator circuit having an input connected to receive a second control signal; and a second binary adder/accumulator circuit having an input connected to receive a data item representative of a frequency shift to be imparted to said output signal, the data item being added iteratively in said second binary adder/accumulator circuit at a rate less than the rate of said output signal, said second binary adder/accumulator circuit generating the second control signal as a carry output thereof when arithmetic overflow occurs in said second binary adder/accumulator circuit, the second control signal serving to increment the addend of said first binary adder/accumulator circuit for one cycle of said first binary adder/accumulator circuit, thereby shifting the frequency of said output signal.

2. A digital frequency synthesizer circuit, comprising:

a counter having an input connected to receive a pulse input signal, and an input connected to receive a first control signal, said counter counting a first number of pulses of the input signal during a first cycle when the first control signal is enabled and a second number of pulses of the input signal during a second cycle when the first control signal is disabled, said counter generating a pulse output signal during a period of N cycles of said counter, the output signal having a nominal frequency which is a fractional submultiple of the frequency of the input pulse signal;

a first adder/accumulator circuit having the output signal coupled thereto, said first adder/accumulator circuit iteratively adding an addend at the rate of the output signal, said first adder/accumulator circuit generating the first control signal as a carry output thereof on the occurrence of arithmetic overflow, the control signals occurring during the period of N cycles of said counter facilitating the substantially even distribution of the first and the second cycles over the period of N cycles; and a second adder/accumulator circuit having an input connected to receive a data item representative of a frequency shift to be imparted to the output signal, the data item being iteratively added in said second binary adder/accumulator circuit at a rate less than the rate of the output signal, said first binary adder/accumulator circuit having an input connected to receive a second control signal, said second binary adder/accumulator circuit generating the second control signal as a carry output thereof when arithmetic overflow occurs in said second binary adder/accumulator circuit, the second control signal incrementing the addend of said first binary adder/accumulator circuit for one cycle of said first binary adder/accumulator circuit, thereby changing the ratio of the first cycles to the second cycles and shifting the frequency of the output signal.

3. A digital frequency synthesizer circuit comprising:

means for receiving a pulse digital input signal having a frequency which is a fractional multiple of the frequency of the desired nominal pulse-digital output signal for dividing the input signal by a fractional divisor to generate a desired nominal pulse-digital output signal, said means for dividing including a dual modulus divider circuit receiving the input signal and a first adder/accumulator circuit coupled to said dual modulus divider circuit, said first adder/accumulator circuit iteratively adding an addend and generating carry signals controlling said dual modulus divider circuit to generate the nominal pulse-digital output signal; and means coupled to said dividing means for shifting the frequency of the output signal while maintaining the phase continuity across the boundary of the frequency shift by periodically altering the fractional divisor, said frequency shifting means including a second adder/accumulator circuit having an input connected to receive a data item representative of a frequency shift to be imparted to the pulse-digital output signal, the data item being iteratively added in said second adder/accumulator circuit at a rate less than the rate of said output signal such that an arithmetic overflow signal is generated, the overflow signal being coupled to said first adder/accumulator circuit and incrementing the addend of said first adder/accumulator circuit.

* * * * *